(12) United States Patent
Seltmann et al.

(10) Patent No.: US 6,493,063 B1
(45) Date of Patent: Dec. 10, 2002

(54) CRITICAL DIMENSION CONTROL IMPROVEMENT METHOD FOR STEP AND SCAN PHOTOLITHOGRAPHY

(75) Inventors: Rolf Seltmann, Am Stockteich (DE); Anna Maria Minvielle, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/344,294

(22) Filed: Jun. 24, 1999

(51) Int. Cl.[7] .......................... G03B 27/42; G03B 27/32
(52) U.S. Cl. ........................... 355/53; 355/77
(58) Field of Search .................. 355/53, 50, 77, 355/71, 55; 430/5, 20, 22; 359/432; 250/492.2

(56) References Cited

U.S. PATENT DOCUMENTS

| | | | | | |
|---|---|---|---|---|---|
| 4,220,697 | A | * | 9/1980 | Wiedemann | 430/58.5 |
| 5,721,608 | A | * | 2/1998 | Taniguchi | 355/53 |
| 5,898,480 | A | * | 4/1999 | Ozawa | 355/67 |
| 6,094,256 | A | * | 7/2000 | Grodnensky et al. | 355/77 |
| 6,115,108 | A | * | 9/2000 | Capodieci | 355/77 |

OTHER PUBLICATIONS

Ackmann P. et al: "Use of Exposure compensation to improve device performance for speed and binning based on electrical parametric feedback into fabrication design." SPIE vol. 3051 pp. 384–390.

* cited by examiner

Primary Examiner—Russell Adams
Assistant Examiner—Peter B. Kim
(74) Attorney, Agent, or Firm—LaRiviere, Grubman & Payne, LLP

(57) ABSTRACT

The invention provides a method and apparatus for reducing the variance of critical dimensions in a semiconductor device, by providing a method and apparatus for measuring lens and reticle error and then providing a method and apparatus for compensating for the error. The critical dimension of a die is measured and used to create a critical dimension function $CD(x,y)$, where y is the direction of scan and x is perpendicular to the direction of scan, for a stepper scanner. $CD(x,y)$ is used to determine the energy distribution $E(x,y)$. $E(x,y)$ is separated into orthogonal functions $E(x)$ and $E(y)$. Changes in the exposure energy or Gray filters or other means are used to compensate for the changes in $E(x)$ and $E(y)$.

12 Claims, 5 Drawing Sheets

CRITICAL DIMENSION CONTROL IMPROVEMENT METHOD FOR STEP AND SCAN PHOTOLITHOGRAPHY

FIELD OF THE INVENTION

The present invention relates to the manufacture of semiconductor devices. More specifically, the invention relates to lithographic exposure in the manufacture of semiconductor devices.

BACKGROUND OF THE INVENTION

Wafer steppers are called the working horses of optical lithography for semiconductor manufacturing. Recently, step and scan systems (scanners) were introduced into manufacturing, which do not expose an image by one single step (as is done by steppers), but instead use a synchronized scanning of the wafer and the reticle through a fixed slit within the associated optics. Step and scan systems are especially used for printing patterns of 200 nm (nanometers) or less in advanced semiconductor manufacturing.

Critical dimensions (CD) of a semiconductor device are the widths of lines and spaces of critical circuit patterns as well as areas of contacts of the semiconductor device. To obtain a good operating semiconductor device, the critical dimensions of the semiconductor device must be very accurate. The CD distribution for gates of transistors must be especially tight over the complete exposure field of the scanners. Every nanometer of a tighter CD-distribution gives a higher operation speed for the resulting semiconductor device.

In practice, there are many contributing factors that cause a greater deviation from the target CD, and therefore a less tight CD-distribution. Some of these factors are the variations in resist thickness and development uncertainties (like variations in development time or temperature). Imperfections in the lens and reticle and also synchronization errors between the wafer and the reticle carriers (stages) add to the deviation from the target CD.

One method of reducing CD-distribution known in the art is optical proximity correction.

The transition from using steppers to scanners also has helped to reduce the effect of imperfections in the reticle on variations from the target CD. In addition, lenses and reticles have been improved to reduce CD-variations. However, reticles still have imperfections (e.g. typical CD-variations of 30 nm on the reticle), so that a 4 times reduction ratio of the lens would cause a CD variation of about 7.5 nm on the wafer. In addition, reticle errors can get enhanced by non-linearities of the lithographic process. This effect is described by the Mask Error Enhancement Factor (MEEF). In an example, a MEEF of 2 would lead to a reticle induced CD variation of 15 nm instead of 7.5 nm. Defocus further may increase the MEEF. In addition, it is still impossible to manufacture error free lenses and exposure systems. As a result, every reticle and lens combination has a distinctive error signature, which increases CD-distribution. The error that is created by the reticle and lens combination is repeated from die to die and wafer to wafer.

It would be advantageous to be able to compensate for exposure system error, such as reticle error and lens error, to reduce CD-distribution.

BRIEF SUMMARY OF THE INVENTION

It is an object of the invention to compensate for exposure system error to reduce CD-distribution.

Accordingly, the foregoing object is accomplished by creating from the resist exposure system an exposure pattern with a distribution of the exposure pattern across an exposure field, measuring the distribution of the exposure pattern across the exposure field, and correcting exposure from the resist exposure system according to the measured distribution of the exposure pattern across the exposure field.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein.

Figure 1:
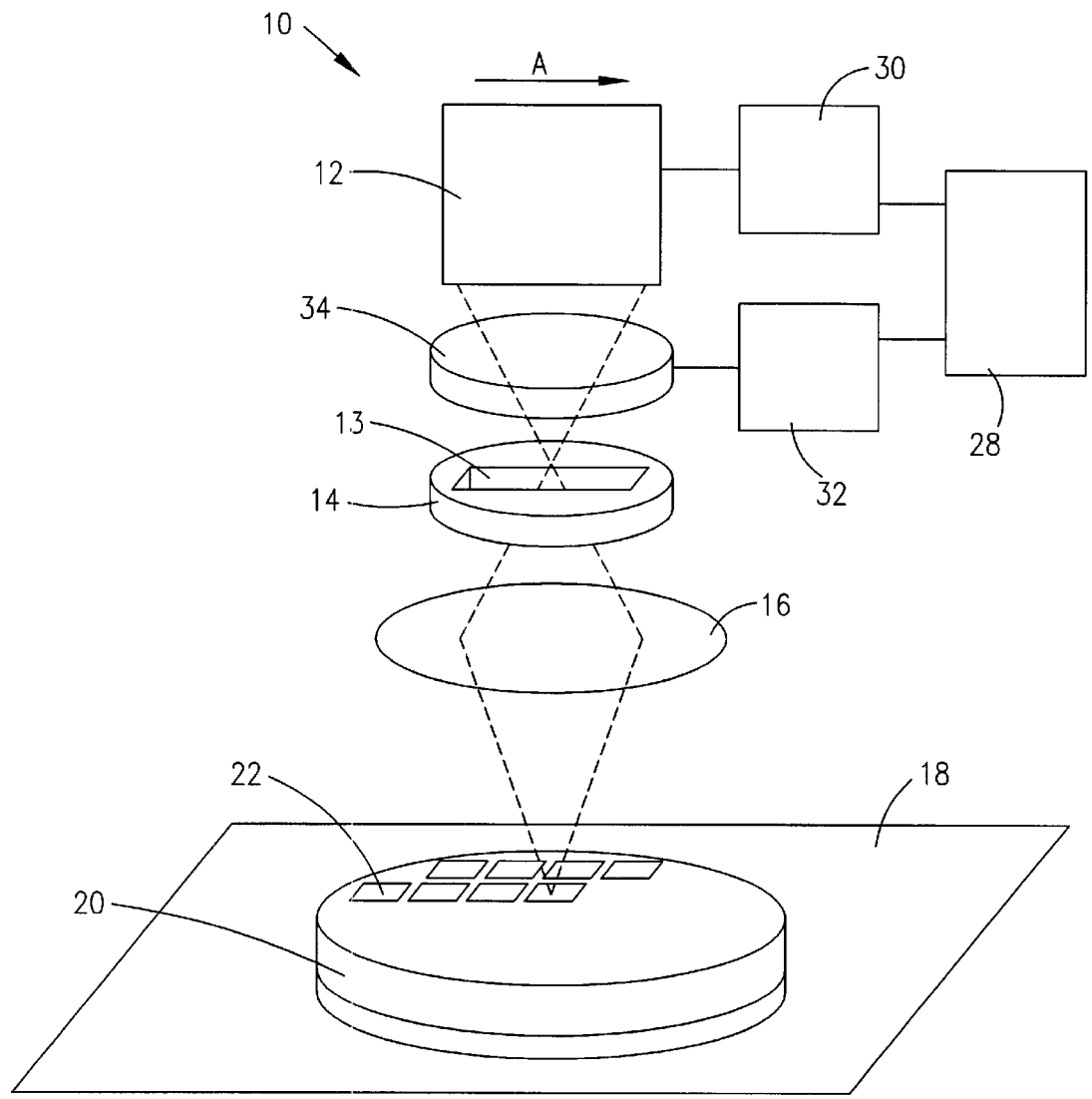
FIG. 1 is a schematic view of a resist exposure system.

Reference numbers refer to the same or equivalent parts of the present invention throughout the several figures of the drawing.

DETAILED DESCRIPTION OF THE INVENTION AND BEST MODE OF THE INVENTION

FIG. 1 is a schematic view of a resist exposure system 10, which uses the invention, and which, in the preferred embodiment, is a step and scan system. The resist exposure system 10 comprises an illumination system 12, a reticle 14, a reduction lens system 16, and a platform 18 which supports semiconductor wafers 20, upon which semiconductor devices are to be built.

A focus exposure matrix (FEM) is printed on a first set of semiconductor wafers 20 with the reticle to determine the optimum exposure energy E, the tolerance for variations from the optimum E for the reticle, the optimum focus of the lens and the tolerance for variations from the optimum focus.

After the optimum exposure energy and focus are determined, a test semiconductor wafer 20 is placed on the platform 18, as shown in FIG. 1. The scanning illumination system 12 produces a slit of light, which is scanned along a direction across the wafer and reticle. In this example, the scanning slit of light scans to the right as viewed in FIG. 1 and indicated by arrow A. Scanning is done by either moving the slit of light across the wafer or moving the wafer and/or reticle past the slit of light so that the light moves relative to the wafer and/or reticle in the scanning direction A. The slit scans across an aperture 13 in the recticle 14. The image of the slit of light passing through the reticle 14 is reduced and focused by the reduction lens system 16 creating an image on the wafer 20. In a step and scan system 10, each scan of the illumination system 12 images a single die of a plurality of dies 22 on the wafer 20. After a die 22 is illuminated, the platform 18 moves the wafer 20, so that the next die may be illuminated.

Figure 2:
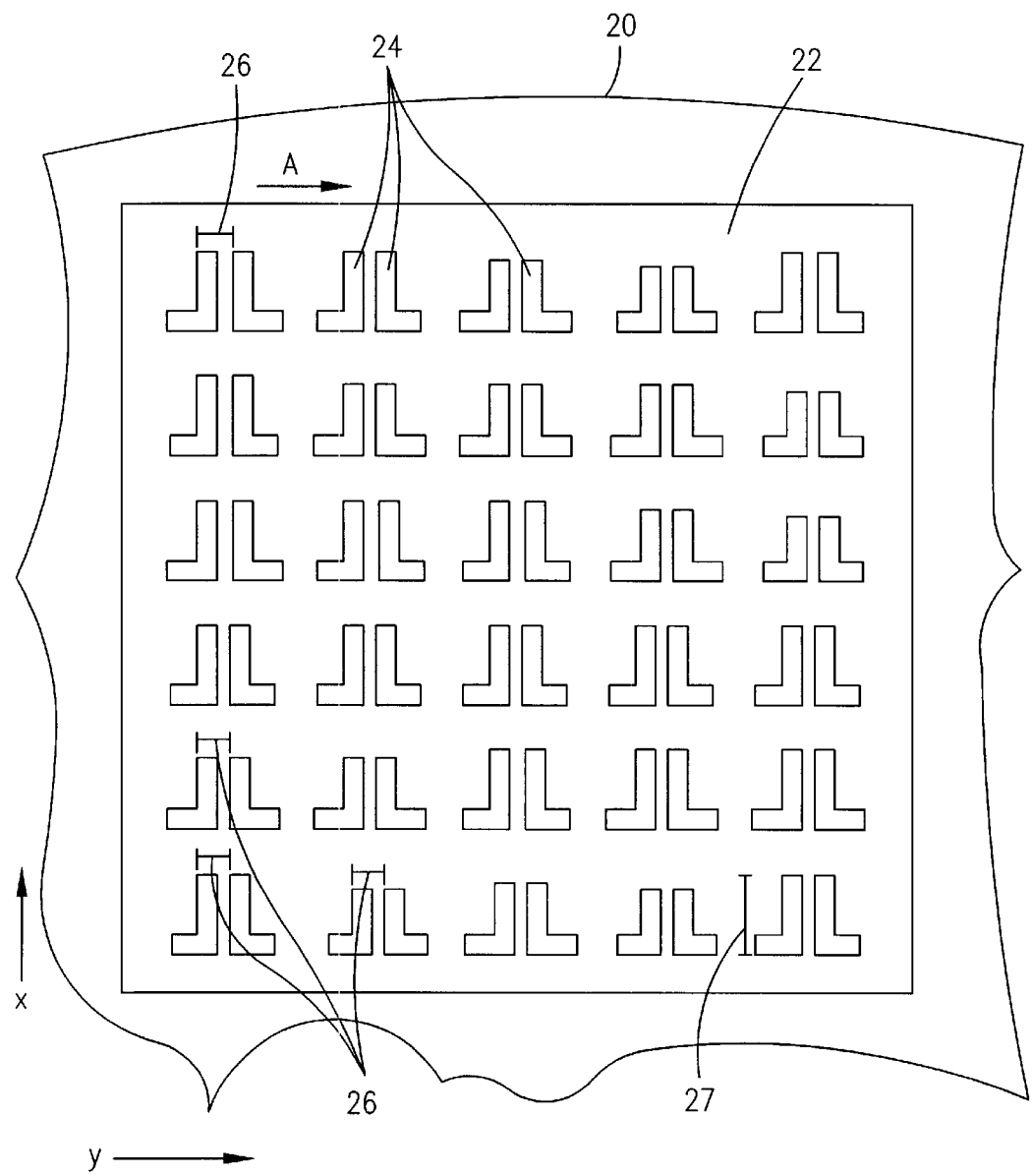
FIG. 2 is an enlarged plan view of a section of a wafer with an enlarged view of a single die.

FIG. 2 is an enlarged plan view of a section of the test semiconductor wafer 20 with an enlarged view of a single die 22. Using the optimum exposure energy E and optimum focus, a pattern of a plurality of images 24 is created on the wafer 20, which creates a pattern of a plurality of images 24 on the single die 22. In this embodiment each image 24 is a pair of objects, with one object being "L" shaped and the other object being shaped like a backwards "L". In this embodiment, only a single layer process is being used. In other embodiments, multiple layers may be used to create complete devices which are measured. At least one critical dimension CD is measured for each image 24. In this example the critical dimension 26 is measured between a beginning edge of the "L" shaped object to the beginning edge of the backwards "L". An x direction and a y direction are used in this example, with the y direction being parallel to the scan direction A, and the x direction being orthogonal to the scan direction as shown. The critical dimensions CD of each image is recorded with the location on the die 22 of the image 24 in the x direction and y direction creating the function CD(x,y) for the die. This provides some measurement of the across field distribution for the reticle 14, illumination system 12, and lens system 16 combination. The across field distribution (distribution of the exposure pattern across the exposure field) is the error pattern attributed to the resist exposure system 10 caused by the combination of components, such as the reticle 14, illumination system 12, and lens system 16 combination, that is a function of where an image is being created on a die, which is indicated by changing critical dimensions of the image according to where an image is on a die. Other critical dimensions, such as the height 27 of each image 24, may also be measured for the creation of the function CD(x,y). In the preferred embodiment, a scanning electron microscope is used to measure the critical dimension. In other embodiments, other methods are used to measure the critical dimension of the images. One such embodiment uses electrical probes.

This process may be repeated over several dies 22 and several wafers 20, since certain imperfections in the reticle 14 and illumination system 12 would be repeated from die to die and wafer to wafer. The individual local $CD_i(x,y)$ for each die is averaged together with $CD_i(x,y)$ of other dies and wafers to obtain CD(x,y). From CD(x,y) an average $CD(CD_{ave})$ is calculated. In a real production environment, the resist exposure system 10 will sometimes deviate from optimum focus. The inventive method takes into account any such deviations. Usually, best focus will occur the most often, and the farther the defocus is from optimum, the less frequent it will happen. To account for a change of CD(x,y) with defocus, the test wafers 20 are printed for different focus settings. CD(x,y) is determined for every focus setting, and a correction algorithm is applied to calculate a weighted average of the CD-distribution. Typically, the distribution with a defocus of zero will be weighted with a factor of 1. The farther an individual focus value is from optimum focus the less the weighing factor will be. Then a fitting algorithm is applied to the final averaged CD distribution, which results in an average CD-plane CD(x,y). One embodiment of doing this is using a linear fit with minimization of the maximum deviation. Another embodiment of doing this is by using a least square fit method. In principle, higher order fits are possible as well.

For different photoresists, there is a known relationship between exposure energy E and critical dimension CD, expressed as CD(E). Taking the inverse of CD(E), E(CD) is obtained. E(x,y) is derived from plugging in the measured values of CD(x,y) into E(CD(x,y)). The average value for E(x,y), which is E0, is calculated by the equation $$\sum_x \sum_y \frac{E(x,y)}{x*y} = E0 \quad (1)$$

Since the optimum exposure was used to create the pattern, the average energy E0 is the nominal energy (the optimum exposure energy), with local energies E(x,y) which may vary from the nominal energy. The function E(x,y) is separated into two orthogonal functions E(x) (a first function) and E(y) (a second function), where y is the direction parallel to the scan direction A, and x is the direction perpendicular to the scan direction as described above.

The separation can be done as follows:
average the two-dimensional matrix E(x,y) over x results in a one-dimensional matrix E(y);
calculate a fit function E(y) out of matrix E(y) by linear regression, least square fit or any higher order fit;
average the two-dimensional matrix E(x,y) over y results in a one-dimensional matrix E(x);
calculate a fit function E(x) out of matrix E(x) by linear regression, least square fit or any higher order fit;

If the average energy to print the desired CD is E0, a dimensionless function is generated by dividing E(x), E(y) by E0:

$$f(x)=E(x)/E0$$
$$f(y)=E(y)/E0$$

where $$\sum_x \frac{f(x)}{x} = 1 \quad (2)$$

$$\sum_y \frac{f(y)}{y} = 1 \quad (3)$$

The two-dimensional function E(x,y) then calculates out of $$E(x,y)=f(x)*f(y)*E0 \quad (4)$$

Some correction is then applied to the local exposure energy E(x,y) during the exposure process as described below.

FIG. 1 also shows a computing system 28, with a storage means where E(x) and E(y) are stored. A test semiconductor wafer is replaced with a production semiconductor wafer 20 with a layer of resist, where semiconductor devices will actually be built. The computing system 28 is electrically connected to a scan direction energy controller 30. In the preferred embodiment, the scan direction energy controller 30, is electrically connected to the illumination system 12 or the platform 18, to control the exposure energy by controlling either the intensity of the light, the pulse frequency of the laser light source, or the scanning speed of the wafer carrier. The computing system 28 is also electrically connected to an orthogonal direction energy controller 32, which controls a device for providing a gray filtering and for tilting the illumination path 34.

In the preferred embodiment, correction is done dynamically in the scan direction and statically in the direction perpendicular to the scan direction. Before the illumination system 12 scans in the y direction, the computing system 28 compares E(x) with E0 to see if E(x) is greater than, less than, or equal to E0. If E(x)>E0, then the computing system 28 sends a signal to the orthogonal direction energy controller 32, which causes the device for providing a gray filtering and tilting the illumination path 34 to provide a gray filtering at point x to reduce the energy from the illumination system 12, and thus the exposure energy, at point x. If E(x)=E0, then no adjustment is needed. If E(x)<E0, then the computing system 28 sends a signal to the orthogonal direction energy controller 32, which causes device for providing a gray filtering and tilting the illumination path 34 to tilt the illumination path to increase the energy from the illumination system 12, and thus the exposure energy. Other methods and apparatus for static correction of the intensity in the x-direction are known in the art.

As the illumination system 12 scans in the y direction, the computing system 28 compares E(y) with E0 to see if E(y) is greater than, less than, or equal to E0. If E(y)>E0, the computing system 28 sends a signal to the scan direction energy controller 30 to reduce the energy of the light from the illumination system 12 which passes through the reticle 14 and impinges on the wafer 20. The scan direction energy controller 30 may lower the exposure energy by lowering the intensity or the pulse frequency of the light from the illumination system 12 or increasing the scanning speed at y. If E(y)=E0, then no adjustment is needed. If E(y)<E0, the computing system 28 sends a signal to the scan direction energy controller 30 to increase the energy of the light from the illumination system 12 which passes through the reticle 14 and is impinges on the wafer 20. The scan direction energy controller 30 may raise the exposure energy by increasing the intensity or the pulse frequency of the light from the illumination system 12 or decreasing the scanning speed at y.

The recticle 14 may be changed for another recticle pattern and the process may be repeated for each recticle. The computing system 28 can store functions E(x) and E(y) for each different recticle measured. In the preferred embodiment, E(x) and E(y) would only be measured for the most important recticles, and the computing system 28 would only provide adjustments for these recticles. For the remaining less critical recticles, no adjustment would be made.

If E0 is not the nominal energy, then E0 may be adjusted so that it would equal the nominal energy.

In other embodiments, measurements are made for all of the recticles.

In another embodiment of the invention, the exposure pattern is created on an electrical measurement device, which measures the exposure pattern directly. In another embodiment, an electrical probe is used to measure characteristics other than CD, to determine across field distribution patterns.

In another embodiment, the invention is used in a stepper that does not scan. In this embodiment, E(x,y) is not separated into E(x) and E(y) since scanning is not used. In this embodiment, each individual E(x,y) is corrected according to whether each local E(x,y) is greater than, less than, or equal to E0.

EXAMPLE

An example of data measured and processed in the preferred embodiment is as follows:

CD(x,y) measurements were taken for five different focuses (focus 0, focus 0.1, focus −0.1, focus 0.2, and focus −0.2. Each focus is provided a weight factor according to the distance the focus is from 0, and the measured values are placed in a matrix according to the (x,y) position.

The following two dimensional 7×5 CD(x,y) matrixes for different foci are measured:

$CD(x, y)_{focus\ 0}$   Weight factor = 0.4

$$\begin{vmatrix} 178 & 181 & 179 & 183 & 180 \\ 180 & 178 & 177 & 182 & 179 \\ 180 & 179 & 178 & 179 & 181 \\ 182 & 179 & 180 & 182 & 180 \\ 183 & 182 & 181 & 181 & 178 \\ 183 & 182 & 180 & 180 & 181 \\ 187 & 186 & 184 & 184 & 184 \end{vmatrix}$$

$CD(x, y)_{focus\ 0.1}$   Weight factor = 0.2

$$\begin{vmatrix} 177 & 180 & 179 & 182 & 180 \\ 181 & 178 & 177 & 182 & 179 \\ 179 & 181 & 178 & 179 & 181 \\ 183 & 180 & 180 & 182 & 180 \\ 183 & 182 & 181 & 181 & 178 \\ 183 & 182 & 180 & 180 & 183 \\ 188 & 188 & 184 & 186 & 185 \end{vmatrix}$$

$CD(x, y)_{focus\ -0.1}$   Weight factor = 0.2

$$\begin{vmatrix} 175 & 179 & 178 & 182 & 177 \\ 180 & 178 & 177 & 181 & 180 \\ 180 & 179 & 178 & 179 & 181 \\ 182 & 179 & 180 & 183 & 180 \\ 183 & 182 & 181 & 181 & 178 \\ 183 & 182 & 182 & 180 & 181 \\ 186 & 188 & 186 & 186 & 184 \end{vmatrix}$$

$CD(x, y)_{focus\ 0.2}$   Weight factor = 0.1

$$\begin{vmatrix} 172 & 177 & 179 & 180 & 178 \\ 177 & 178 & 177 & 182 & 179 \\ 180 & 180 & 177 & 179 & 181 \\ 184 & 179 & 182 & 182 & 181 \\ 184 & 182 & 181 & 181 & 178 \\ 189 & 182 & 181 & 180 & 181 \\ 190 & 187 & 185 & 184 & 186 \end{vmatrix}$$

$CD(x, y)_{focus\ -0.2}$   Weight factor = 0.1

$$\begin{vmatrix} 177 & 177 & 178 & 179 & 179 \\ 176 & 177 & 174 & 182 & 179 \\ 180 & 180 & 176 & 180 & 182 \\ 183 & 179 & 182 & 182 & 183 \\ 182 & 180 & 182 & 183 & 182 \\ 189 & 185 & 181 & 182 & 186 \\ 188 & 186 & 183 & 184 & 185 \end{vmatrix}$$

Taking the weighted average of each $CD(x,y)_{focus(i)}$ using the equation $$\Sigma_i CD(x,y)_{focus(i)} * \text{Weightfactor}(i) = \text{weightedaverage} CD(x,y)$$

the two dimensional 7×5 weighted average CD(x,y) matrix is calculated as $$\text{Weighted average } CD(x, y)$$

$$\begin{vmatrix} 177 & 180 & 179 & 182 & 179 \\ 180 & 178 & 177 & 182 & 179 \\ 180 & 180 & 177 & 179 & 181 \\ 182 & 179 & 180 & 182 & 180 \\ 183 & 182 & 181 & 181 & 179 \\ 185 & 182 & 181 & 181 & 182 \\ 187 & 187 & 184 & 185 & 185 \end{vmatrix}$$

Using the equation $$\sum_x \sum_y \frac{WeightedaverageCD(x, y)}{x * y} = CD_{mean}$$

$CD_{mean}$ is calculated as equal to 181.

Taking the inverse of CD(E), E(CD) is obtained. E(x,y) is derived from plugging in the measured values of CD(x,y) into E(CD(x,y)). Thus obtaining:

$$E(x, y) = (CD(x, y) - CD_{mean}) * 0.08 \frac{mJ}{nm} + 15mJ$$

where E0=15 mJ and which is used to obtain a two dimensional 7×5 matrix E(x,y).

$$\begin{vmatrix} 14.64 & 14.89 & 14.81 & 15.06 & 14.83 \\ 14.89 & 14.75 & 14.68 & 15.05 & 14.85 \\ 14.91 & 14.90 & 14.70 & 14.85 & 14.99 \\ 15.09 & 14.87 & 14.93 & 15.07 & 14.95 \\ 15.16 & 15.09 & 14.98 & 15.01 & 14.81 \\ 15.29 & 15.10 & 14.97 & 14.96 & 15.07 \\ 15.51 & 15.47 & 15.26 & 15.32 & 15.28 \end{vmatrix}$$

Placing the values of the E(x,y) matrix into an (x,y) table results in:

TABLE 1

| E(x,y) | x | R1 | R2 | R3 | R4 | R5 |
|---|---|---|---|---|---|---|
| | 1 | 14.64 | 14.89 | 14.81 | 15.06 | 14.83 |
| | 2 | 14.89 | 14.75 | 14.68 | 15.05 | 14.85 |
| | 3 | 14.91 | 14.90 | 14.70 | 14.85 | 14.99 |
| | 4 | 15.09 | 14.87 | 14.93 | 15.07 | 14.95 |
| | 5 | 15.16 | 15.09 | 14.98 | 15.01 | 14.81 |
| | 6 | 15.29 | 15.10 | 14.97 | 14.96 | 15.07 |
| | 7 | 15.51 | 15.47 | 15.26 | 15.32 | 15.28 |

Figure 3:
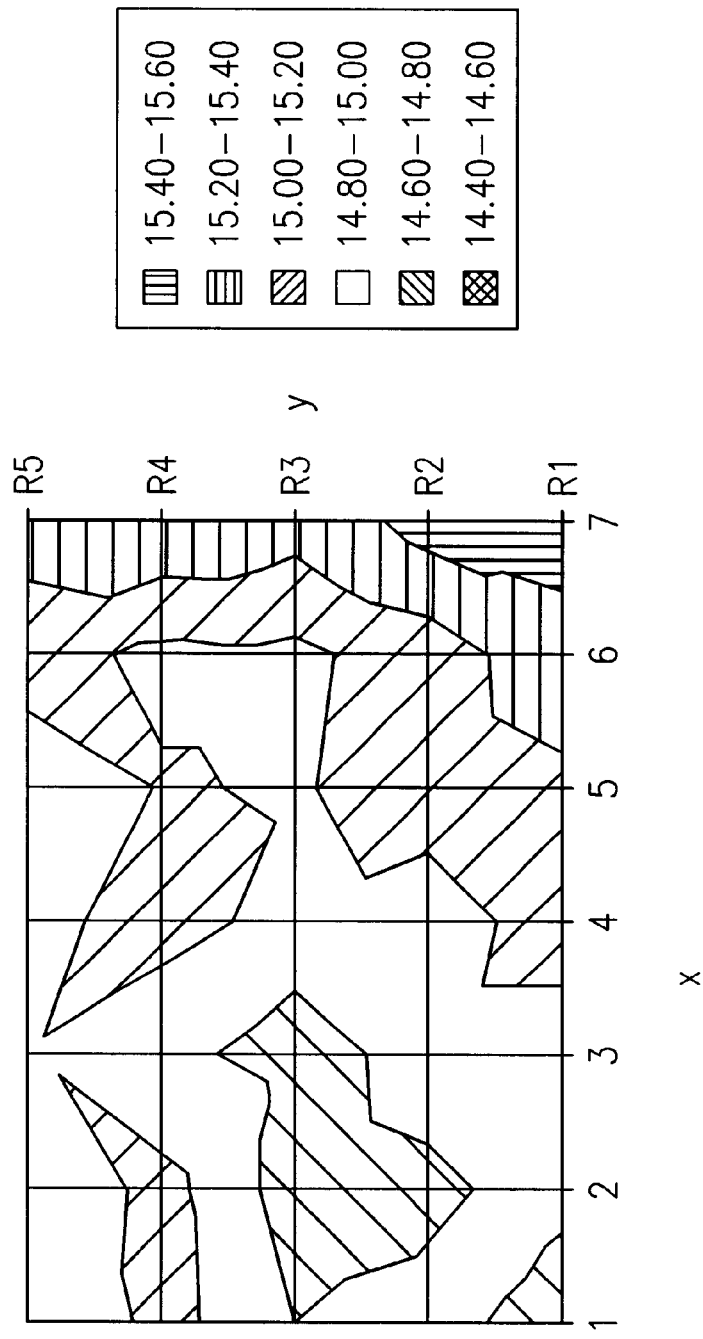
FIG. 3 is a contour plot of the two-dimensional exposure function $E(x,y)$.

FIG. 3 is a graph of Table 1, with the x coordinates along the horizontal axis, and the y coordinates along the vertical axis, plotting values of E(x,y) to yield a contour plot of the two dimensional exposure function E(x,y).

E(x,y) is then averaged over x using the equation $$\frac{\sum_x E(x, y)}{5} = E(y)$$

to yield the E(y) one dimensional 7×1 matrix:

$$\begin{vmatrix} 14.85 \\ 14.84 \\ 14.87 \\ 14.93 \\ 15.01 \\ 15.08 \\ 15.37 \end{vmatrix}$$

E(x,y) is then averaged over y using the equation $$\frac{\sum_y E(x, y)}{7} = E(x)$$

to yield the E(x) one dimensional 1×5 matrix:

$$\begin{vmatrix} 15.07 & 15.01 & 14.90 & 15.05 & 14.97 \end{vmatrix}$$

Figure 4:
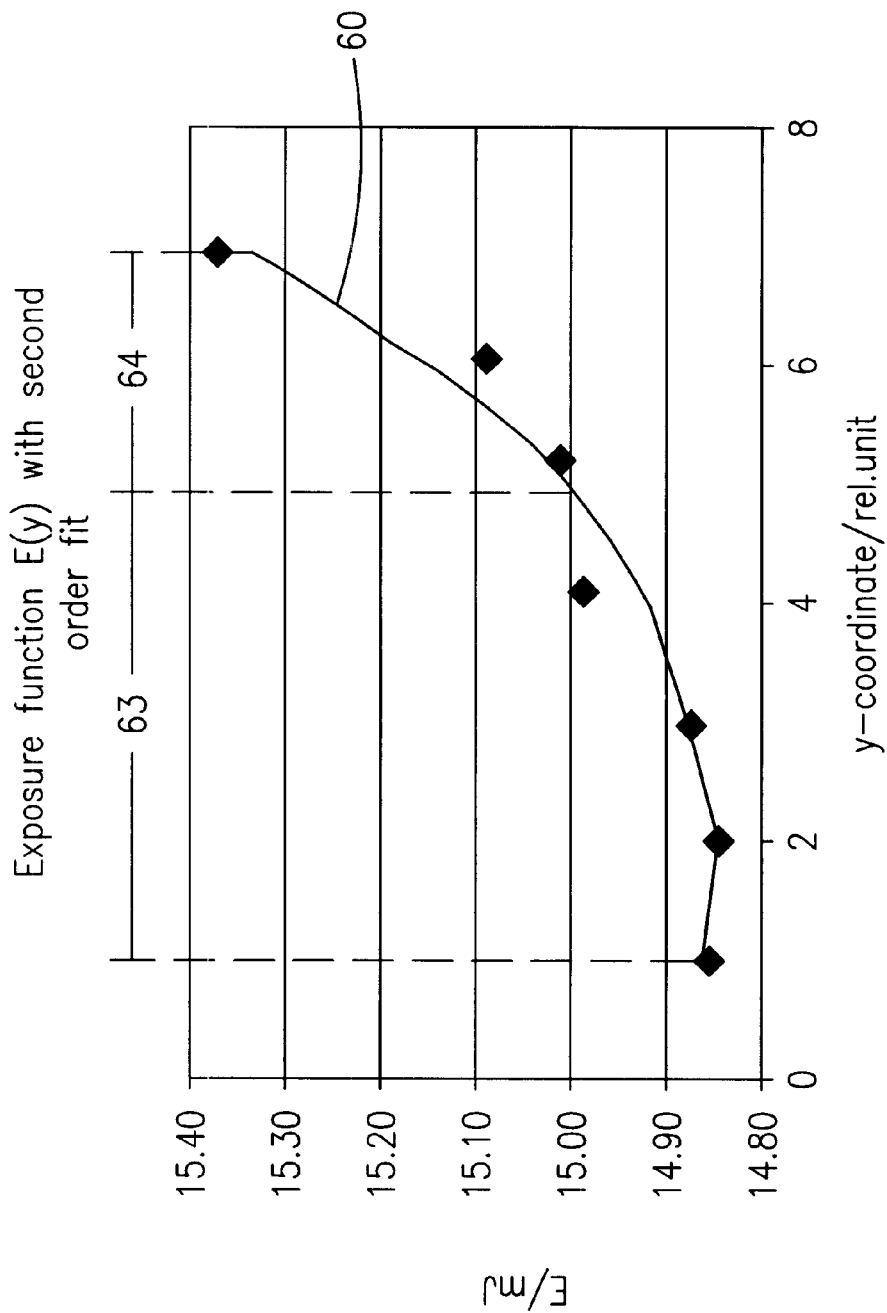
FIG. 4 is a graph of $E(y)$.

FIG. 4 is a graph of E(y), with the values of E(y) along the vertical axis and y along the horizontal axis. The E(y) fit curve 60 is a best fit curve for the points.

Figure 5:
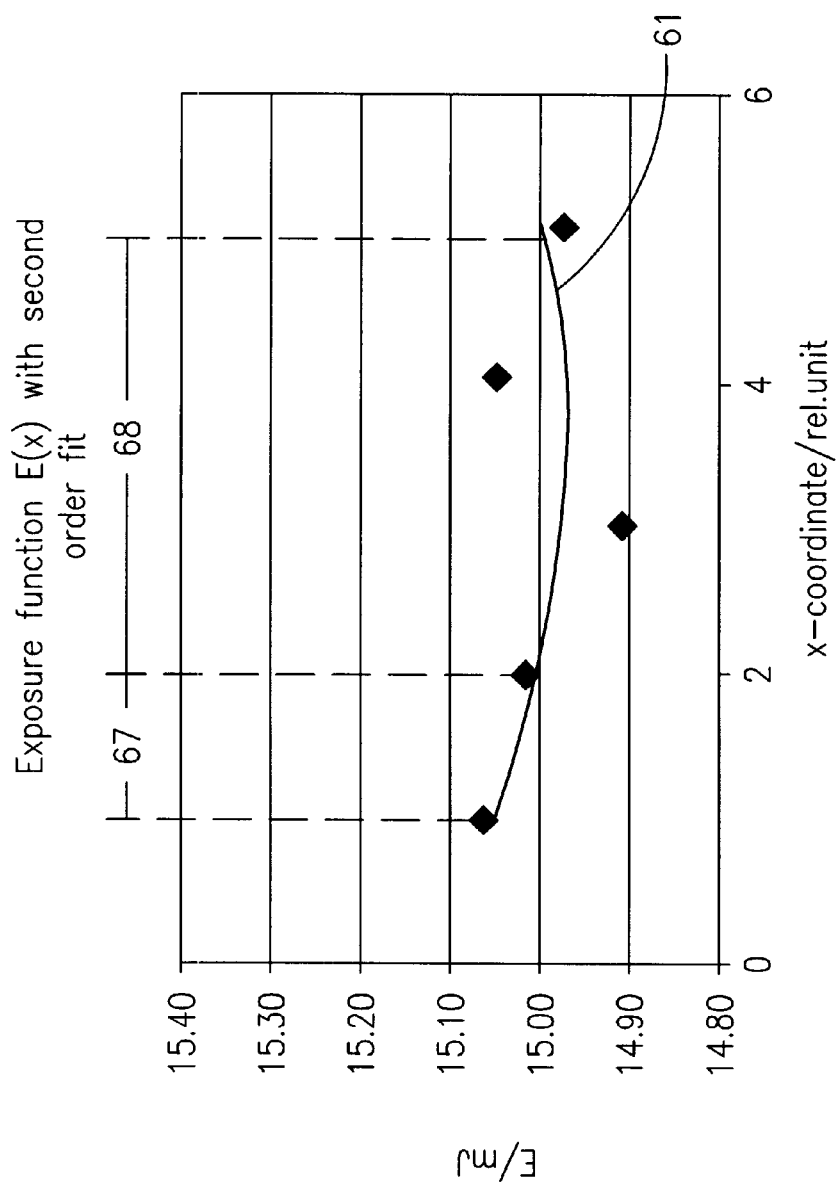
FIG. 5 is a graph of $E(x)$.

FIG. 5 is a graph of E(x), with the values of E(x) along the vertical axis and x along the horizontal axis. The E(x) fit curve 61 is a best fit curve for the points.

The E(y) fit curve 60 is used to determine at what locations, as the illumination system 12 scans in the y direction, the light beam scan energy needs to be dynamically increased or decreased. For the first part 63 of the E(y) fit curve 60, the E(y) fit curve is below the desired exposure energy of 15 mJ (milliJoules). As the illumination system 12 scans in the y direction along locations corresponding to the values of y in the first part 63 of the E(y) fit curve 60 (for example y=1,2,3,4) the illumination system 12 increases the intensity of the illumination system 12 to increase the exposure energy. The amount that the intensity of the illumination system 12 is increased at a point y is proportional to the distance between 15 mJ and the E(y) fit curve at point y. For the second part 64 of the E(y) fit curve 60, the E(y) fit curve 61 is above the desired exposure energy 15 mJ. As the illumination system 12 scans in the y direction for values of y in the second part 64 of the E(y) fit curve 60 (for example y=6,7) the illumination system 12 decreases the intensity of the illumination system 12 to decrease the exposure energy. The amount that the intensity of the illumination system 12 is decreased at a point y is proportional to the distance between 15 mJ and the E(y) fit curve at point y.

The E(x) fit curve 61 is used to determine at what locations perpendicular to the direction of scan the exposure energy can be statically increased or decreased. For the first part 67 of the E(x) fit curve 61 the E(x) fit curve is above the desired exposure energy of 15 mJ. Gray filters are placed along locations designated by values of x in the first part 67 of the E(x) fit curve 61 (for example x=1 to decrease the exposure energy. The amount of gray filtering needed at a point x is proportional to the distance between 15 mJ and the E(x) fit curve at point x. For the second part 68 of the E(x) fit curve 61, the E(x) fit curve 61 is below the desired exposure energy 15 mJ. The illumination path is tilted to increase exposure energy for locations designated by values of x in the first part 68 of the E(x) fit curve 61. The amount of illumination path tilting at a point x is proportional to the distance between 15 mJ and the E(x) fit curve at point x.

The increase or decrease of exposure energy is tailored so that the resulting exposure energy is close to the desired exposure energy.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is specifically disclosed herein.

We claim:

1. A method for reducing critical dimension variation in a resist exposure system having a lens and a reticle, comprising:
   A) creating from the resist exposure system an exposure pattern with a distribution of the exposure pattern across an exposure field;
   B) measuring the distribution of the exposure pattern across the exposure field by
      generating an illumination beam with a cross section in the shape of a band with a length and a width which passes to the reticle,
      scanning the illumination beam across the reticle in a scan direction, wherein the length of the band is perpendicular to the scan direction and wherein the width of the band is parallel to the scan direction, and
      focusing the illumination beam onto a layer of resist on a semiconductor wafer; and
   C) correcting exposure from the resist exposure system according to the measured distribution of the exposure pattern across the exposure field by
      calculating local exposure energies from the distribution of the exposure pattern across the exposure field,
      determining a nominal exposure energy, and
      comparing the local exposure intensities with the nominal exposure energy by
         deriving an exposure function from the local exposure energies, and
         comparing the value of the exposure function at a location with the nominal exposure energy by
            separating the exposure function into a first function which is a function of a distance along the scan direction and is independent of a distance along a direction perpendicular to the scan direction, and a second function which is a function of the distance along the direction perpendicular to the scan direction and independent of the distance along the scan direction,
            comparing the nominal exposure energy with the first function at a location along the scan direction, and
            comparing the nominal exposure energy with the second function at a location along the direction perpendicular to the scan direction.

2. The method, as recited in claim 1, when the illumination beam scans across the reticle, the illumination beam passes locations on the reticle along the scanning direction, wherein the step of correcting the exposure energy, further comprises the steps of:
   using the comparing of the nominal exposure energy with the first function to determine whether to increase or decrease exposure energy as the as the illumination beam passes the locations on the reticle;
   dynamically adjusting the exposure energy of the illumination beam as the illumination beam passes the locations on the reticle;
   using the comparing of the nominal exposure energy with the second function to determine whether to increase or decrease the exposure energy along the length of the band; and
   statically adjusting the exposure energy at points along length of the band.

3. The method, as recited in claim 2, wherein the step of dynamically adjusting the exposure energy of the illumination beam comprises the step of changing a scanning speed of the illumination beam.

4. The method, as recited in claim 2, wherein the step of dynamically adjusting the exposure energy of the illumination beam which has a pulse frequency comprises the step of changing the pulse frequency of the illumination beam.

5. The method, as recited in claim 2, wherein the step of statically adjusting the exposure energy comprises the step of applying a gray filter at a point along the length of the band.

6. The method, as recited in claim 2, wherein the step of statically adjusting the exposure energy comprises the step of tilting the illumination path at a point along the length of the band.

7. The method, as recited in claim 2, wherein the step of dynamically adjusting the exposure energy of the illumination beam which has an intensity comprises the step of changing the intensity of the illumination beam.

8. The method, as recited in claim 1, further comprising the steps of:
   creating a focus exposure matrix;
   determining the optimum exposure energy from the focus exposure matrix; and
   determining the optimum focus from the focus exposure matrix.

9. The method, as recited in claim 8, wherein the step of creating from the resist exposure system an exposure pattern with a distribution of the exposure pattern across an exposure field, comprises the step of creating a plurality of exposure patterns on a plurality of wafers at different focus settings.

10. The method, as recited in claim 9, wherein the step of creating from the resist exposure system an exposure pattern, further comprises the step of using a weighted average to average measured distributions of the exposure patterns between the different focus settings.

11. The method, as recited in claim 1, wherein the step of creating from the resist exposure system an exposure pattern with a distribution of the exposure pattern across an exposure field, comprises the step of measuring critical dimensions of the exposure pattern.

12. A resist exposure system, comprising:
   an illumination system;
   a reticle;
   a lens system for providing an illumination path;
   means for storing a local exposure energy function,
      wherein the storing means comprises
         creating from a resist exposure system an exposure pattern with a distribution of the exposure pattern across an exposure field,
         measuring the distribution of the exposure pattern across the exposure field by generating an illumination beam with a cross section in the shape of a band with a length and a width which passes to the reticle,
         scanning the illumination beam across the reticle in a scan direction, wherein the length of the band is perpendicular to the scan direction and wherein the width of the band is parallel to the scan direction, and focusing the illumination beam onto a layer of resist on a semiconductor wafer;

means for comparing the local exposure energy function with a nominal energy, wherein the comparing means comprises correcting exposure from the resist exposure system according to the measured distribution of the exposure pattern across the exposure field by calculating local exposure energies from the distribution of the exposure pattern across the exposure field, determining a nominal exposure energy, comparing the local exposure intensities with the nominal exposure energy by deriving an exposure function from the local exposure energies, comparing the value of the exposure function at a location with the nominal exposure energy by separating the exposure function into a first function which is a function of a distance along the scan direction and is independent of a distance along a direction perpendicular to the scan direction, and a second function which is a function of the distance along the direction perpendicular to the scan direction and independent of the distance along the scan direction, comparing the nominal exposure energy with the first function at a location along the scan direction, and comparing the nominal exposure energy with the second function at a location along the direction perpendicular to the scan direction; and means for correcting a local exposure energy, wherein the means for correcting local exposure energy is electrically connected to an orthogonal direction energy controller which controls a device for providing gray filtering and for tilting the illumination path.

* * * * *